(12) United States Patent
Iwanaga

(10) Patent No.: US 9,391,657 B2
(45) Date of Patent: Jul. 12, 2016

(54) ANTENNA MATCHING DEVICE

(71) Applicant: Murata Manufacturing Co., Ltd., Nagaokakyo-shi, Kyoto-fu (JP)

(72) Inventor: Minoru Iwanaga, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 14/560,198

(22) Filed: Dec. 4, 2014

(65) Prior Publication Data

US 2015/0087254 A1 Mar. 26, 2015

Related U.S. Application Data

(63) Continuation of application No. PCT/JP2013/061145, filed on Apr. 15, 2013.

(30) Foreign Application Priority Data

Jul. 18, 2012 (JP) ................. 2012-159420

(51) Int. Cl.
| | |
|---|---|
| H03C 1/52 | (2006.01) |
| H04B 1/10 | (2006.01) |
| H03H 7/38 | (2006.01) |
| H04B 1/04 | (2006.01) |
| H03C 3/00 | (2006.01) |

(52) U.S. Cl.
CPC ............. *H04B 1/109* (2013.01); *H03H 7/38* (2013.01); *H04B 1/0458* (2013.01); *H03H 2007/386* (2013.01)

(58) Field of Classification Search
CPC ...... H03H 7/38; H03H 7/40; H03H 2007/386

USPC .................. 455/107; 333/17.3, 100–103, 124
See application file for complete search history.

(56) References Cited

U.S. PATENT DOCUMENTS

| | | | | |
|---|---|---|---|---|
| 6,360,089 | B1 * | 3/2002 | Saitoh | ................. H04B 7/0802 340/10.1 |
| 7,831,226 | B2 * | 11/2010 | Kwon | ................. H04B 1/0458 333/1 |
| 8,288,895 | B2 * | 10/2012 | Yoon | ......................... H03J 3/20 307/109 |

FOREIGN PATENT DOCUMENTS

| | | |
|---|---|---|
| JP | 10-098405 A | 4/1998 |
| JP | 2000-278168 A | 10/2000 |
| JP | 2004-064604 A | 2/2004 |

(Continued)

OTHER PUBLICATIONS

JP2008-154107 Translation; Jul. 3, 2008.*

(Continued)

*Primary Examiner* — Lee Nguyen
(74) *Attorney, Agent, or Firm* — Keating & Bennett, LLP

(57) ABSTRACT

An antenna matching device includes an antenna terminal connected to an antenna and an RF terminal connected to an RF circuit. The antenna terminal and the RF terminal are connected to each other through a first transmission path only via an inductor. The antenna terminal and the RF terminal are connected to each other through a second transmission path only via an SPST switch. By switching between the open state and the closed state of the switch in accordance with the frequency of an RF signal, the first transmission channel or the second transmission channel is selected.

19 Claims, 9 Drawing Sheets

(56) References Cited

FOREIGN PATENT DOCUMENTS

| | | |
|---|---|---|
| JP | 2008-154107 A | 7/2008 |
| JP | 2009-253945 A | 10/2009 |

OTHER PUBLICATIONS

Official Communication issued in International Patent Application No. PCT/JP2013/061145, mailed on Jul. 16, 2013.

* cited by examiner

ANTENNA MATCHING DEVICE

BACKGROUND OF THE INVENTION

1. Field of the Invention

The present invention relates to an antenna matching device configured to perform impedance matching between a wide-band antenna and an RF circuit.

2. Description of the Related Art

In accordance with the diversification of communication standards, information communication terminals that are capable of communicating a plurality of types of radio frequency signals are demanded. Frequency bands handled in individual communication standards are different. Accordingly, in a known information communication terminal, individual antennas are disposed in accordance with respective communication standards, that is, in accordance with respective radio-frequency signal bands to be sent and received.

However, in accordance with a reduced size of information communication terminals, there is an increasing demand for the use of a common antenna. Thus, an antenna that is capable of sending and receiving radio-frequency signals in a wide frequency range (broadband) including individual frequency bands handled in multiple communication standards is being used. For example, in some current cellular phones, an antenna that is capable of sending and receiving 800 MHz to 2 GHz band signals is used.

If such an antenna that is capable of sending and receiving wide-band signals (wide-band antenna) is used, it is necessary to perform impedance matching between this antenna and an RF circuit for each of the frequency bands handled in the communication standards. For example, in an antenna device disclosed in Japanese Unexamined Patent Application Publication No. 10-98405, an antenna matching device that can switch between frequency signals by using a switch is disposed between an antenna and an RF circuit.

FIG. 9 is a circuit diagram illustrating a configuration of the related art, such as that disclosed in Japanese Unexamined Patent Application Publication No. 10-98405. A known antenna matching device 10P is connected to an antenna 101 via an antenna terminal $P_{ANT}$. The antenna matching device 10P is connected to an RF circuit 102 via an RF terminal $P_{RF}$.

A switch 12P is a so-called SPDT switch and switches and connects a first selection terminal or a second selection terminal to a common terminal. The common terminal is connected to the RF terminal $P_{RF}$. The first selection terminal is directly connected to the antenna terminal $P_{ANT}$ only via a transmission line. The path through which the first selection terminal and the antenna terminal $P_{ANT}$ are connected to each other serves as a first transmission path 111P. The second selection terminal is connected to the antenna terminal $P_{ANT}$ via an inductor 11P. The path through which the second selection terminal and the antenna terminal $P_{ANT}$ are connected to each other serves as a second transmission path 112P.

The antenna matching device configured as described above performs control so that the switch 12P is switched in accordance with a frequency to be sent or received. If a communication signal of a first frequency, which is a low frequency, is sent or received, the antenna matching device selects the first selection terminal (first transmission path 111P). If a communication signal of a second frequency, which is a high frequency, is sent or received, the antenna matching device selects the second selection terminal (second transmission path 112P).

With this configuration, the antenna matching device is set so that, when the antenna 101 and the RF circuit 102 are directly connected to each other, the impedance of the antenna 101 and that of the RF circuit 102 will match each other at the first frequency. With this setting, if the antenna 101 and the RF circuit 102 are connected as a result of the switch 12P selecting the first transmission path 111P, it is possible to reduce return loss of a communication signal of the first frequency.

Then, the inductance of the inductor 11P connected to the second selection path 112P is suitably set so that the impedance of the antenna 101 and that of the RF circuit 102 will match each other at the second frequency. With this setting, if the antenna 101 and the RF circuit 102 are connected as a result of the switch 12P selecting the second transmission path 112P, it is possible to reduce return loss of a communication signal of the second frequency.

However, in the above-described configuration of the known antenna matching device, all the transmission lines are connected to the switch. Accordingly, regardless of which frequency band of a communication signal is selected, a communication signal is transmitted via this switch. The switch inevitably causes transmission loss. Thus, regardless of which frequency band of a communication signal is transmitted, transmission loss occurs due to the switch. The transmission loss caused by a switch is greater than that when a communication signal is transmitted via a single passive element, such as an inductor or a capacitor.

Thus, even if the return loss is reduced by the antenna matching device 10P, it is not possible to sufficiently reduce the transmission loss of the antenna matching device 10P, as a whole, for all frequency signals to be transmitted due to the transmission loss of the switch 12P.

SUMMARY OF THE INVENTION

Preferred embodiments of the present invention provide an antenna matching device that is configured to perform impedance matching so that transmission loss is reduced to a predetermined value or lower for communication signals of individual frequency bands included in a wide frequency range.

Various preferred embodiments of the present invention are concerned with an antenna matching device connected between an antenna and an RF circuit so as to perform impedance matching between the antenna and the RF circuit. The antenna matching device preferably has the following characteristic. In the antenna matching device according to various preferred embodiments of the present invention, between an antenna terminal connected to the antenna and an RF terminal connected to the RF circuit, a first transmission path to which only a first impedance adjusting element is connected and a second transmission path including a first switch are connected in parallel with each other.

With this configuration, when the first switch is closed, the second transmission path is selected, thus making it possible to reduce the transmission loss of a second frequency corresponding to impedance characteristics of the antenna to a predetermined value or lower. When the first switch is opened, the first transmission path is selected, thus making it possible to the return loss of a first frequency for which impedance matching has been performed in accordance with the value of the first impedance adjusting element to a predetermined value or lower. In this case, since a signal of the first frequency is transmitted without passing through a switch, transmission loss caused by a switch does not occur. Accordingly, the transmission loss when the first transmission path is selected to transmit a signal of the first frequency is reduced. As a result, it is possible to reduce the transmission loss for a signal of the first frequency in the entire antenna matching device to a predetermined value or lower.

An antenna matching device according to a preferred embodiment of the present invention may be configured in the following manner. An antenna matching device may include a third transmission path in which a second impedance adjusting element and a second switch are connected in series with each other. The third transmission path may be connected in parallel with the first and second transmission paths between the antenna terminal and the RF terminal.

With this configuration, by providing the third transmission path, it is also possible to reduce the transmission loss for a signal of another frequency to a predetermined value or lower.

In the antenna matching device according to a preferred embodiment of the present invention, the second impedance adjusting element may preferably be connected between the second switch and the antenna terminal.

With this configuration, the impedance of the antenna terminal viewed from the second switch is equal to or approximately equal to 50Ω, for example, thus making it possible to further reduce the transmission loss in the third transmission path.

In the antenna matching device according to a preferred embodiment of the present invention, a value of the first impedance adjusting element may preferably be determined so that impedance matching will be performed in a frequency band of a signal for which a gain of the antenna is minimal among frequency bands to be used.

As discussed in a description of the related art, the transmission loss caused by a switch is greater than that caused by an impedance adjusting element. In other words, the transmission loss caused by an impedance adjusting element is smaller than that caused by a switch. Accordingly, by using the above-described configuration, a signal for which the transmission loss is most desirably avoided is transmitted between the antenna and the RF circuit with low loss.

An antenna matching device according to a preferred embodiment of the present invention may preferably further include a shunt-connection impedance adjusting unit including a third impedance adjusting element connected between the RF terminal and a ground.

With this configuration, impedance matching between the antenna and the RF circuit preferably is performed by using the shunt-connection impedance adjusting unit. This makes it possible to perform impedance matching so as to further reduce return loss.

An antenna matching device according to a preferred embodiment of the present invention may preferably be configured in the following manner. The shunt-connection impedance adjusting unit may include a third switch connected between the third impedance adjusting element and the RF terminal, and a series circuit of a fourth switch and a fourth impedance adjusting element. The series circuit of the fourth switch and the fourth impedance adjusting element may be connected in parallel with the third switch. The fourth impedance adjusting element may be disposed for the third impedance adjusting element in relation to the fourth switch.

With the above-described configuration, a more specific mode of the shunt-connection impedance adjusting unit is described. In the above-described configuration, the amount by which impedance is adjusted in the shunt-connection impedance adjusting unit is changed in accordance with a frequency of a signal to be transmitted. It is thus possible to perform more suitable impedance matching in accordance with each of multiple communication signals having different frequencies.

In this case, by connecting the fourth impedance adjusting element between the third impedance adjusting element in relation to the third switch and the third impedance adjusting element in relation to the fourth switch, the influence of the parasitic capacitance of the switches is significantly reduced, thus making it possible to prevent a decrease in the characteristics caused by a combination of a switch and an impedance adjusting element.

An antenna matching device according to a preferred embodiment of the present invention may preferably be configured in the following manner. The antenna matching device may be constituted by a multilayer body which includes a stack of dielectric layers on which conductor patterns implementing a circuit of the antenna matching device are provided. A plurality of switches may be constituted by at least two mount-type switch elements. A recessed portion may be provided in a region of a bottom surface of the multilayer body. The mount-type switch elements may be mounted on a top surface of the multilayer body and on a surface of the recessed portion parallel or substantially parallel with the top surface.

With the above-described configuration, the multilayer body is disposed such that the mount-type switch elements are superposed on each other, as viewed from above. With this configuration, the area of the antenna matching device is reduced to be smaller than that when the mount-type switch elements are mounted only on the top surface of the multilayer body.

The antenna matching device may preferably be configured in the following manner. In a state in which the mount-type switch elements are mounted on the top surface of the multilayer body and on the surface of the recessed portion parallel or substantially parallel with the top surface of the multilayer body, mounting terminals of the mount-type switch elements to be connected to the RF terminal may be disposed on the same side as a side of a main unit of the mount-type switch elements to be connected to the RF terminal.

According to various preferred embodiments of the present invention, it is possible to significantly reduce the transmission loss to a desired value or lower for each of multiple communication signals having different frequency bands included in a wide frequency range.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
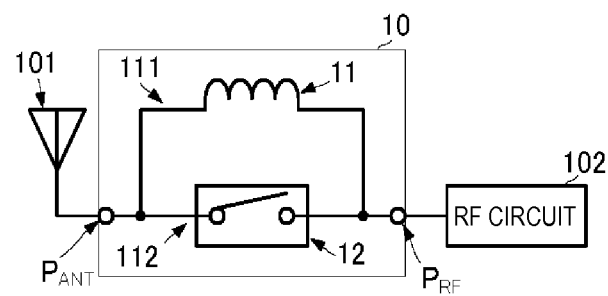
FIG. 1 is a block diagram illustrating an antenna matching device according to a first preferred embodiment of the present invention and a wireless communication apparatus including this antenna matching device.

An antenna matching device according to a first preferred embodiment of the present invention and an RF front end module will be described below with reference to the drawings. FIG. 1 is a block diagram illustrating an antenna matching device according to the first preferred embodiment of the present invention and a wireless communication apparatus including this antenna matching device.

An antenna matching device 10 includes an antenna terminal $P_{ANT}$ and an RF terminal $P_{RF}$. The antenna terminal $P_{ANT}$ is connected to an antenna 101. The RF terminal $P_{RF}$ is connected to an RF circuit 102. The antenna matching device 10, the antenna 101, and the RF circuit 102 define a wireless-communication front end module (wireless communication apparatus).

The antenna 101 is configured to send and receive RF signals in a wide frequency range (broadband) and is constituted by, for example, a conductor line. The antenna 101 is configured to send and receive signals of, for example, 800 MHz to 2 GHz. However, this does not mean that the antenna 101 is capable of sending and receiving signals of all frequencies bands equally with a high gain. Instead, there are some frequency bands for which a predetermined high gain is obtained (frequency bands with low loss), but on the other hand, there are some frequency bands for which a predetermined gain is not obtained (frequency bands with high loss). For example, among three frequency bands to be used, the antenna 101 preferably is configured to achieve the maximal gain for a frequency band of 1.8 to 2.0 GHz, a slightly smaller gain for a frequency band of 1.4 to 1.6 GHz, and an even smaller gain for a frequency band around 800 MHz. That is, when the antenna 101 is directly connected to the RF circuit 102, it is capable of transmitting a signal around 2.0 GHz to the RF circuit 102 with minimal loss.

The RF circuit 102 is constituted by, for example, an RF switch circuit configured to switch between a VCO which generates a communication signal to be sent and a demodulator which demodulates a received communication signal and to connect the selected VCO or demodulator to the antenna 101. The RF circuit 102 is constituted by a circuit configured to send and receive a plurality of types of communication signals by the antenna 101.

The antenna matching device 10 includes an inductor 11 and a switch 12. The inductor 11 corresponds to a "first impedance adjusting element". The inductor 11 may be implemented by a mount-type chip component or a conductor line of a predetermined length, width, and configuration, for example.

The switch 12 corresponds to a "first switch". The switch 12 is configured to switch between an open state and a closed state of the switch 12 on the basis of a control signal received from an external source. The switch 12 preferably is a so-called SPST (Single-Pole/Single-Throw) switch, for example.

The inductor 11 and the switch 12 are connected in parallel with each other between the antenna terminal $P_{ANT}$ and the RF terminal $P_{RF}$. In other words, the inductor 11 and the antenna 12 are connected specifically in the following manner between the antenna terminal $P_{ANT}$ and the RF terminal $P_{RF}$.

One end of the inductor 11 is connected to the antenna terminal $P_{ANT}$, and the other end thereof is connected to the RF terminal $P_{RF}$. The path through which the antenna terminal $P_{ANT}$ and the RF terminal $P_{RF}$ are connected to each other only via the inductor 11 defines and serves as a first transmission path 111.

One end of the switch 12 is connected to the antenna terminal $P_{ANT}$, and the other end thereof is connected to the RF terminal $P_{RF}$. The path through which the antenna terminal $P_{ANT}$ and the RF terminal $P_{RF}$ are connected to each other only via the switch 12 defines and serves as a second transmission path 112.

Figure 2A:
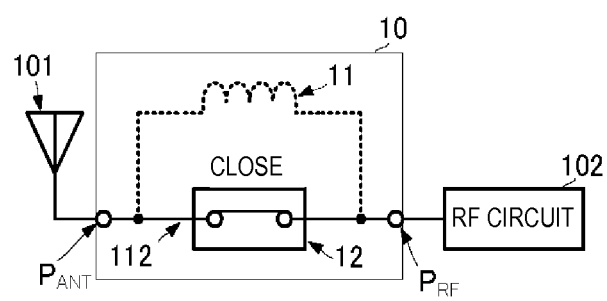
FIGS. 2A and 2B show block diagrams illustrating operation modes of the antenna matching device according to the first preferred embodiment of the present invention.
Figure 2B:
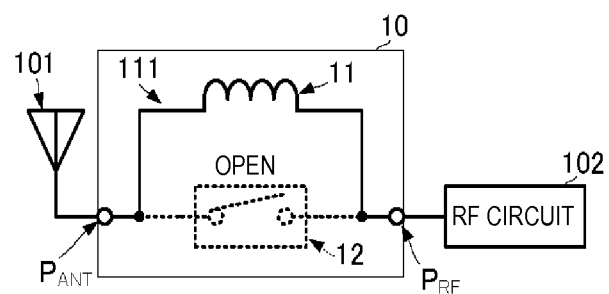

Operation modes of the antenna matching device 10 of this preferred embodiment will be described below. FIGS. 2A and 2B show block diagrams illustrating operation modes of the antenna matching device 10 of this preferred embodiment. FIG. 2A illustrates an operation mode in which the switch 12 is closed, and FIG. 2B illustrates an operation mode in which the switch 12 is opened. A description will be given below, assuming that an RF signal received by the antenna 101 is transmitted to the RF circuit 102. The signal level of a received signal is lower than that of a sending signal. Thus, by considering a case in which a signal is received, the effect of the antenna matching device 101 is exhibited more effectively.

When the switch 12 is closed, the second transmission path 112 is selected. Accordingly, the antenna 101 and the RF circuit 102 are connected to each other via the switch 12.

In this case, the impedance of the inductor 11 (first transmission path 111) for an RF signal is increased due to the inductance of the inductor 11. In particular, the frequency of a signal to be transmitted through the second transmission path 112 is as high as 1.8 GHz to 2.0 GHz, for example, and is thus positioned in a high frequency side of a frequency range to be transmitted in the wireless communication apparatus. Accordingly, the impedance of the first transmission path 111 in this frequency band becomes even higher. Thus, in the RF-signal frequency band, the first transmission path 111 is changed to an open state, as viewed from the antenna terminal $P_{ANT}$. As a result, the RF signal is transmitted from the antenna 101 to the RF circuit 102 mainly via the second transmission path 112.

As discussed above, the antenna 101 obtains the maximal gain for a frequency band of 1.8 GHz to 2.0 GHz, for example. Accordingly, if the antenna 101 and the RF circuit 102 are directly connected to each other only via the second transmission path 112, that is, via the switch 12, it is possible to transmit an RF signal of 1.8 GHz to 2.0 GHz, for example, from the antenna 101 to the RF circuit 102 with low loss.

Although transmission loss caused by the switch 12 occurs, the gain of the antenna 101 in this band is high. Accordingly, it is possible to input an RF signal into the RF circuit 102 while maintaining a certain level of the RF signal.

When the switch 12 is opened, the first transmission path 111 is selected. Accordingly, the antenna 101 and the RF circuit 102 are connected to each other via the inductor 11.

The inductor 11 is configured to adjust the impedance so as to increase the effective length of the antenna 101. Accordingly, if an RF signal is received via the inductor 11, it is possible to adjust matching between the antenna and the RF circuit in accordance with the inductance of the inductor 11 even when a signal of a frequency lower than a frequency for which the maximal gain of the antenna 101 is obtained is received. This makes it possible to significantly reduce return loss and to accordingly obtain a high gain.

More specifically, since the antenna 101 obtains the maximal gain for a frequency band of 1.8 GHz to 2.0 GHz, for example, as discussed above, by suitably setting the inductance of the inductor 11, the gain for a frequency band of 850 MHz to 900 MHz, for example, is increased. With this arrangement, if the antenna 101 and the RF circuit 102 are connected to each other via the first transmission path 111, that is, via the inductor 11, it is possible to transmit an RF signal of 850 MHz to 900 MHz, for example (low frequency signal in a frequency range to be transmitted in the wireless communication apparatus) from the antenna 101 to the RF circuit 102 with low loss.

In this case, since an RF signal is transmitted without passing through a switch, transmission loss caused by a switch does not occur. Transmission loss caused by the inductor 11, that is, transmission loss caused by a single passive element, is smaller than that by a switch. It is thus possible to input an RF signal of 850 MHz to 900 MHz, for example, received by the antenna 101 into the RF circuit 102 with low loss.

As described above, with the configuration of this preferred embodiment, it is possible to transmit RF signals so that transmission loss will be reduced to a predetermined level or lower for each of multiple frequency bands within a predetermined frequency range. In this case, the use of only one SPST switch is sufficient to switch between signals of two frequency bands and transmit a selected band signal. Thus, the size of an antenna matching device is reduced to be smaller than that by the use of a known SPDT switch.

Figure 3:
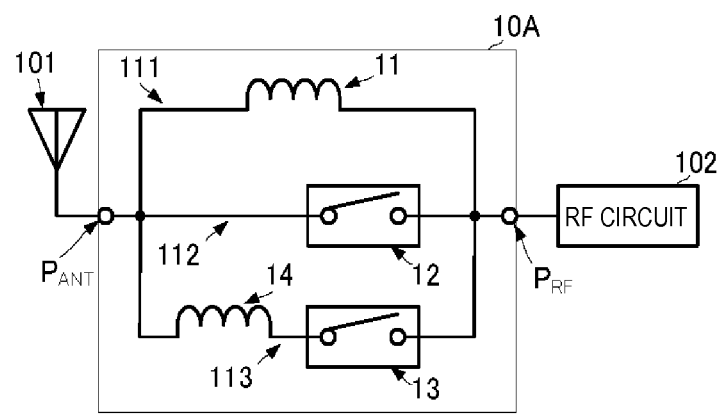
FIG. 3 is a block diagram illustrating an antenna matching device according to a second preferred embodiment of the present invention and a wireless communication apparatus including this antenna matching device.

An antenna matching device according to a second preferred embodiment will be described below with reference to the drawings. FIG. 3 is a block diagram illustrating an antenna matching device according to the second preferred embodiment and a wireless communication apparatus including this antenna matching device. An antenna matching device 10A of this preferred embodiment is different from the antenna matching device 10 of the first preferred embodiment in that a third transmission path 113 is added. The other configurations of the antenna matching device 10A are preferably the same or substantially the same as those of the antenna matching device 10 of the first preferred embodiment.

The antenna matching device 10A preferably includes a switch 13 and an inductor 14. The switch 13 corresponds to a "second switch". The switch 13 is configured to switch between an open state and a closed state of the switch 13 on the basis of a control signal received from an external source. The switch is a so-called SPST (Single-Pole/Single-Throw) switch, for example. The inductor 14 corresponds to a "second impedance adjusting element". The inductor 14 may be implemented by a mount-type chip component or a conductor line of a predetermined length, width, and configuration, for example.

The switch 13 and the inductor 14 are connected in series with each other between the antenna terminal $P_{ANT}$ and the RF terminal $P_{RF}$. In this case, a series circuit of the switch 13 and the inductor 14 is connected in parallel with the inductor 11 and the switch 12.

More specifically, the switch 13 and the inductor 14 are connected in the following manner between the antenna terminal $P_{ANT}$ and the RF terminal $P_{RF}$.

One end of the inductor 14 is connected to the antenna terminal $P_{ANT}$, and the other end of the inductor 14 is connected to one end of the switch 13. The other end of the switch 13 is connected to the RF terminal $P_{RF}$. The path through which the antenna terminal $P_{ANT}$ and the RF terminal $P_{RF}$ are connected to each other via this series circuit of the inductor 14 and the switch 13 defines and serves as the third transmission path 113.

Figure 4A:
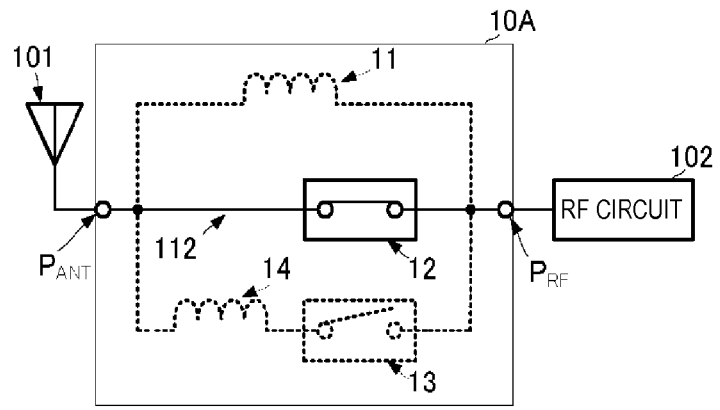
FIGS. 4A-4C show block diagrams illustrating operation modes of the antenna matching device according to the second preferred embodiment of the present invention.
Figure 4B:
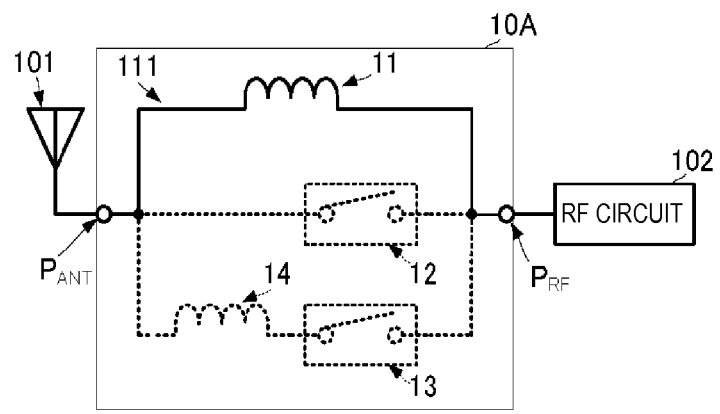
Figure 4C:
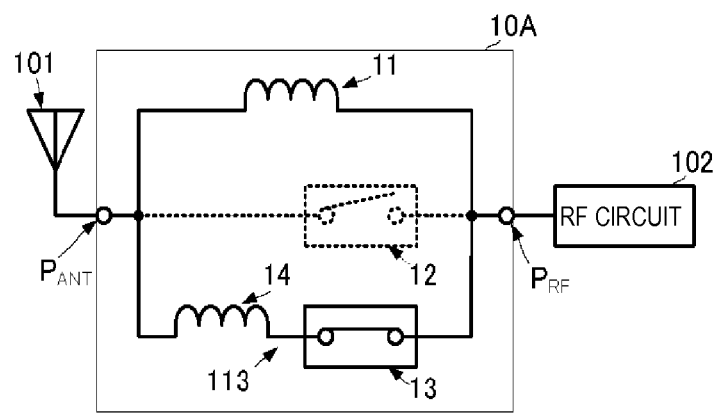
Figure 5A:
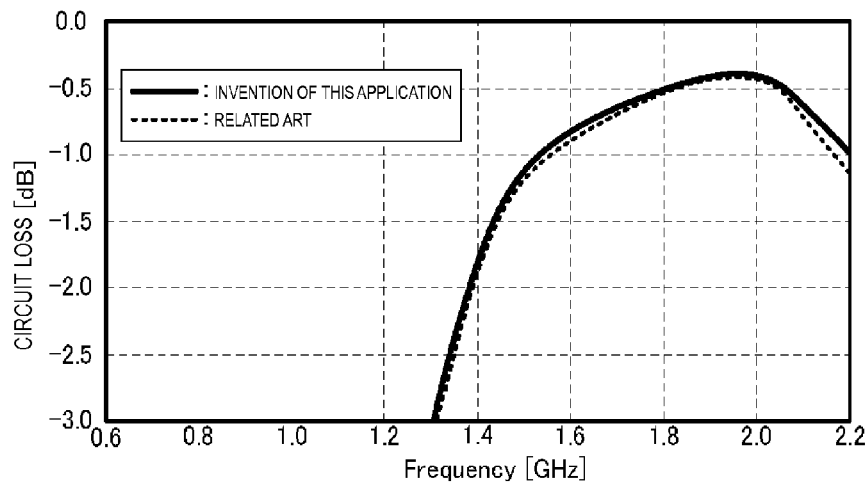
FIGS. 5A-5C shows diagrams illustrating frequency characteristics concerning circuit loss in the individual operation modes of the antenna matching device according to the second preferred embodiment of the present invention.
Figure 5B:
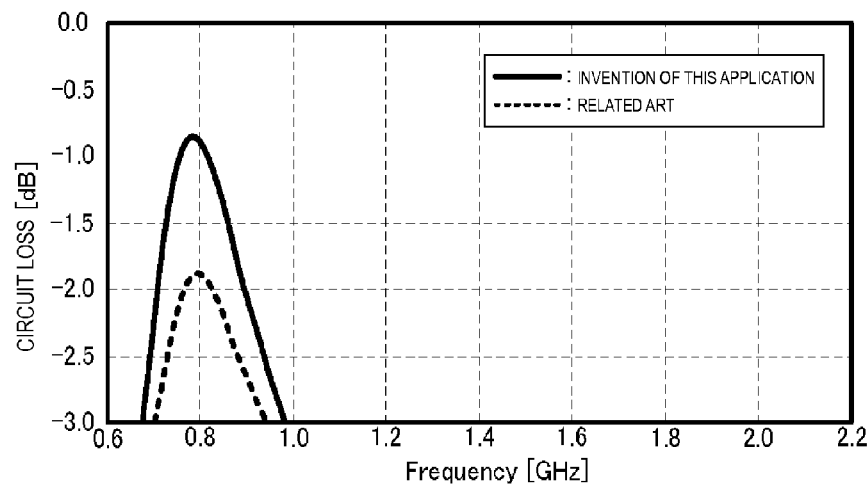
Figure 5C:
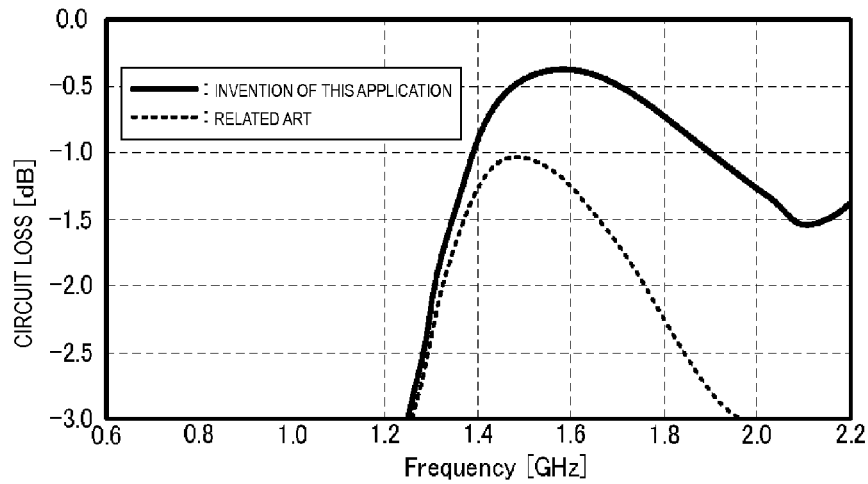

Operation modes of the antenna matching device 10A of this preferred embodiment will be described below. FIGS. 4A-4C show block diagrams illustrating operation modes of the antenna matching device 10A of this preferred embodiment. FIG. 4A illustrates an operation mode in which the switch 12 is closed and the switch 13 is opened, FIG. 4B illustrates an operation mode in which both of the switches 12 and 13 are opened, and FIG. 4C illustrates an operation mode in which the switch 12 is opened and the switch 13 is closed. FIGS. 5A-5C show diagrams illustrating frequency characteristics concerning circuit loss in the individual operation modes of the antenna matching device of this preferred embodiment. FIGS. 5A-5C respectively illustrate the frequency characteristics when the antenna matching device 10A is in the operation modes shown in FIGS. 4A-4C. The circuit loss refers to transmission loss of an RF signal passing through the antenna matching device, and does not include the influence caused by return loss. In this preferred embodiment, as well as in the first preferred embodiment, a description will be given below, assuming that an RF signal received by the antenna 101 is transmitted to the RF circuit 102.

When the switch 12 is closed and the switch 13 is opened, the third transmission path 113 is opened (disconnected), and the second transmission path 112 is selected. Accordingly, the antenna 101 and the RF circuit 102 are connected to each other via the switch 12.

In this case, as in the first preferred embodiment, the impedance of the inductor 11 (first transmission path 111) for an RF signal is increased due to the inductance of the inductor 11. Accordingly, in the RF-signal frequency band, the first transmission path 111 is changed to an open state, as viewed from the antenna terminal $P_{ANT}$. As a result, the RF signal is transmitted from the antenna 101 to the RF circuit 102 only via the second transmission path 112.

Figure 9:
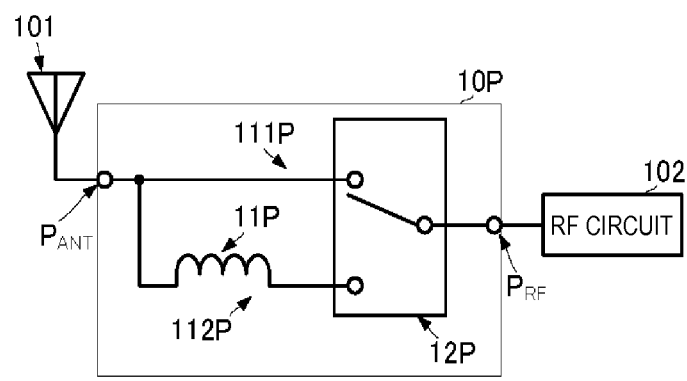
FIG. 9 is a circuit diagram illustrating a known antenna matching device, such as that disclosed in Japanese Unexamined Patent Application Publication No. 10-98405.

Specific simulation results, as illustrated in FIG. 5A, show that with the use of a configuration of various preferred embodiments of the present invention, circuit loss around a frequency band of 1.8 GHz to 2.0 GHz, for example, is reduced to a smaller level than that of a configuration of the related art (in FIG. 9, a configuration in which there are two paths between the antenna and the RF circuit, and the two paths are switched by using an SPDT switch).

Thus, as in the first preferred embodiment, it is possible to transmit an RF signal of 1.8 GHz to 2.0 GHz, for example, from the antenna 101 to the RF circuit 102 with low loss.

When both of the switches 12 and 13 are opened, the first transmission path 111 is selected. Accordingly, the antenna 101 and the RF circuit 102 are connected to each other via the inductor 11.

Specific simulation results, as illustrated in FIG. 5B, show that with the use of a configuration of various preferred embodiments of the present invention, since an RF signal does not pass through a switch element, circuit loss in a frequency band around 800 MHz is significantly reduced to a smaller level than that of a configuration of the related art (configuration using an SPDT switch). In the antenna 101, only the minimal gain is obtained for the frequency band around 800 MHz among the frequency bands to be used, and thus, a signal of the frequency band around 800 MHz is a frequency signal that is most desirably transmitted with the minimal loss in various preferred embodiments of the present invention.

The inductor 11 is configured to adjust the impedance so as to increase the effective length of the antenna 101. Accordingly, if an RF signal is received via the inductor 11, it is possible to adjust matching between the antenna and the RF circuit in accordance with the inductance of the inductor 11 even when a signal of a frequency lower than a frequency for which the maximal gain of the antenna 101 is obtained is received. This makes it possible to reduce return loss and to accordingly obtain a high gain.

Thus, as in the first preferred embodiment, it is possible to input an RF signal of 850 MHz to 900 MHz, for example, received by the antenna 101 into the RF circuit 102 with low loss.

When the switch 13 is closed and the switch 12 is opened, the second transmission path 112 is opened (disconnected), and the first and third transmission paths 111 and 113 are selected. Accordingly, the antenna 101 and the RF circuit 102 are connected to each other via a parallel circuit of the inductors 11 and 14.

The inductors 11 and 14 are configured to adjust the impedance so as to increase the effective length of the antenna 101. Accordingly, if an RF signal is received via a parallel circuit of the inductors 11 and 14, adjustment is made to obtain a high gain at a position of a lower frequency than the frequency for which the maximal gain of the antenna 101 is obtained by a frequency corresponding to the inductance of the parallel circuit of the inductors 11 and 14. In this case, the inductance of the parallel circuit of the inductors 11 and 14 is smaller than that of the single inductor 11.

Accordingly, when the gain of a frequency of 850 MHz to 900 MHz, for example, is increased by suitably setting the inductance of the inductor 11, as discussed above, it is possible to increase the gain of a predetermined frequency band between the frequency band of 850 MHz to 900 MHz, for example, and the frequency band of 1.8 GHz to 2.0 GHz, for example, for which a higher gain of the antenna 101 is obtained, by the parallel circuit of the inductors 11 and 14. For example, by suitably setting the inductance of the inductor 14, the gain of a frequency band around 1.5 GHz is increased.

With this configuration, if the antenna 101 and the RF circuit 102 are connected to each other via the first and third transmission paths 111 and 113, that is, via the parallel circuit of the inductors 11 and 14, an RF signal around 1.5 GHz (intermediate frequency signal in a frequency range to be transmitted in the wireless communication apparatus), for example, is transmitted from the antenna 101 to the RF circuit 102 with low loss.

In this case, in the first transmission path 111, an RF signal is transmitted without passing through any switch. Thus, transmission loss is significantly reduced to a smaller level than a case in which each of the first and third transmission paths 111 and 113 includes a switch.

Specific simulation results, as illustrated in FIG. 5C, show that with the use of a configuration of various preferred embodiments of the present invention, circuit loss in a frequency band of about 1.5 GHz is significantly reduced to a smaller level than that of a configuration of the related art (configuration using an SPDT switch).

It is thus possible to input an RF signal of about 1.5 GHz received by the antenna 101 into the RF circuit 102 with low loss.

As described above, with the configuration of this preferred embodiment, it is possible to transmit RF signals so that transmission loss is reduced to a predetermined level or lower for each of multiple frequency bands within a predetermined frequency range. In this case, the use of two SPST switches is sufficient to switch among signals of three frequency bands and transmitting a selected band signal. Thus, the size of an antenna matching device is significantly reduced to be smaller than that by the use of a known SPDT switch.

In the above-described configuration, the inductor 14 is preferably connected to the end of the switch 13 adjacent to the antenna terminal $P_{ANT}$ (the end of the switch 13 closer to the antenna 101). Alternatively, the inductor 14 may be connected to the end of the switch 13 adjacent to the RF terminal $P_{RF}$ (the end of the switch 13 closer to the RF circuit 102). However, by connecting the inductor 14 to the end of the switch 13 adjacent to the antenna terminal $P_{ANT}$, it is possible to allow the impedance of the antenna terminal $P_{ANT}$ viewed from the switch 13 to be equal to or approximately equal to 50Ω, thus making it possible to further reduce the transmission loss.

Figure 6:
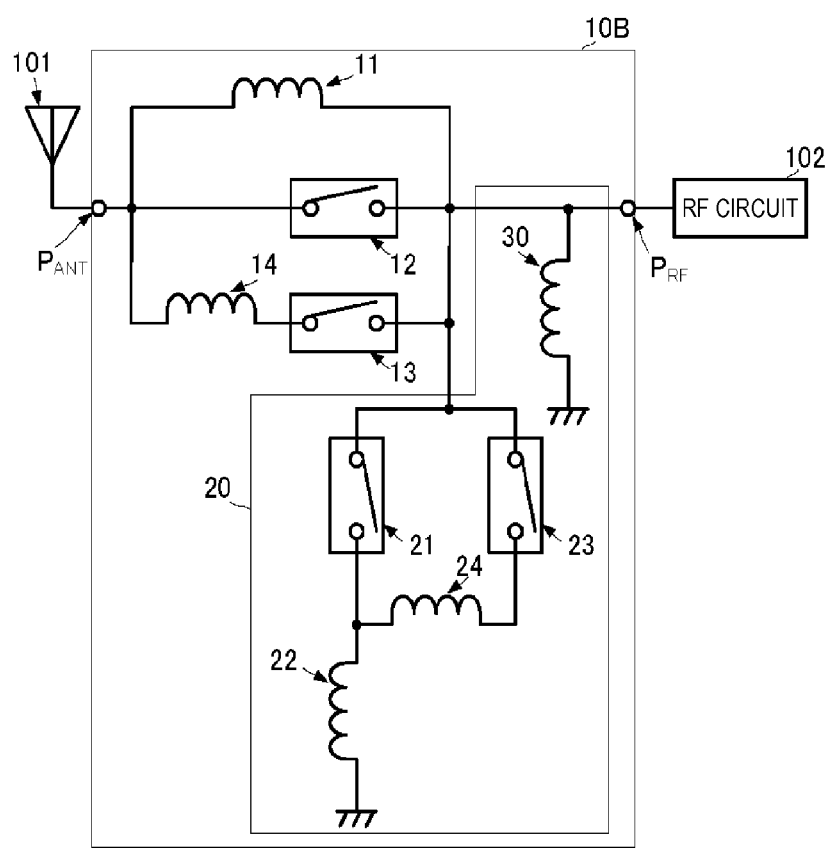
FIG. 6 is a block diagram illustrating an antenna matching device according to a third preferred embodiment of the present invention and a wireless communication apparatus including this antenna matching device.

An antenna matching device according to a third preferred embodiment will be described below with reference to the drawings. FIG. 6 is a block diagram illustrating an antenna matching device according to the third preferred embodiment and a wireless communication apparatus including this antenna matching device. An antenna matching device 10B of this preferred embodiment is different from the antenna matching device 10A of the second preferred embodiment in that a shunt-connection impedance adjusting unit 20 is added. The other configurations of the antenna matching device 10B are preferably the same or substantially the same as those of the antenna matching device 10A of the second preferred embodiment.

The impedance adjusting unit 20 includes switches 21 and 23 and inductors 22, 24, and 30. The inductor 30 is connected between the RF terminal $P_{RF}$ and a ground.

The switches 21 and 23 preferably are SPST switches. One end of each of the switches 21 and 23 is connected to the RF terminal $P_{RF}$. The other end of the switch 21 is connected to one end of the inductor 24, while the other end of the switch 23 is connected to the other end of the inductor 24. In other words, the inductor 24 is connected between the other ends of the switches 21 and 23. That is, a series circuit of the switch 23 and the inductor 24 is connected in parallel with the switch 21.

The other end of the switch 21 and the end of the inductor 24 connected to the switch 21 are connected to one end of the inductor 22. The other end of the inductor 22 is connected to a ground. In other words, a parallel circuit of the switch 21 and the series circuit of the switch 23 and the inductor 24 is connected in series with the inductor 22 between the RF terminal $P_{RF}$ and a ground.

The opening and closing of the switches 21 and 23 is suitably controlled in accordance with the control for the opening and closing of the above-described switches 12 and 13. When both of the switches 21 and 23 are opened, the shunt-connection impedance adjusting unit is defined only by the inductor 30. When the switch 21 is closed and the switch 23 is opened, the shunt-connection impedance adjusting unit is defined by a parallel circuit of the inductors 30 and 22. When the switch 21 is opened and the switch 23 is closed, the shunt-connection impedance adjusting unit is defined by a parallel circuit of the inductor 30 and a series circuit of the inductors 22 and 24.

In this manner, with the use of the configuration of this preferred embodiment, it is possible to perform three different types of impedance adjustments. By combining these three different types of impedance adjustments with three different types of impedance adjustments using the above-described first, second, and third transmission paths 111, 112, and 113, impedance matching between the antenna 101 and the RF circuit 102 is performed more appropriately.

In the configuration of this preferred embodiment, three types of impedance adjustments are capable of being made to the shunt-connection impedance adjusting unit by using two SPST switches. Thus, the size of the shunt-connection impedance adjusting unit is significantly reduced to be smaller than that by the use of a known SPDT switch, thus making it possible to reduce the size of an antenna matching device.

In the configuration of this preferred embodiment, when the switch 21 is closed and the switch 23 is opened, the inductor 22 is selected, and when the switch 21 is opened and the switch 23 is closed, a series inductor of the inductors 22 and 24 is selected. With this configuration, the Q factor of the shunt-connection impedance adjusting unit 20 is improved.

Figure 7:
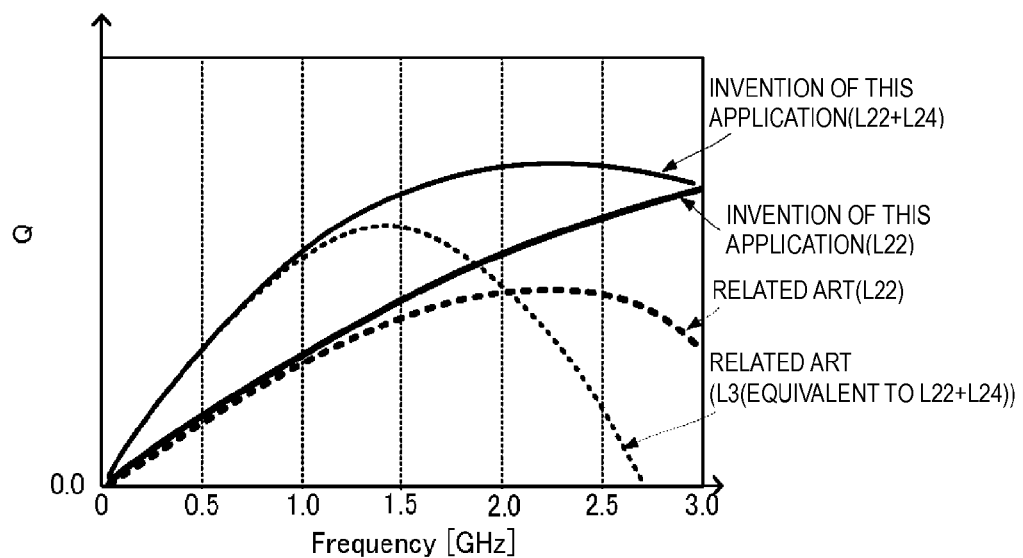
FIG. 7 is a diagram illustrating frequency characteristics concerning the Q factor of a shunt-connection impedance adjusting unit according to the third preferred embodiment of the present invention and the Q factor of a configuration of the related art.

FIG. 7 is a diagram illustrating frequency characteristics concerning the Q factor of the shunt-connection impedance adjusting unit according to the third preferred embodiment of the present invention and the Q factor of a configuration of the related art. In FIG. 7, the solid lines indicate the Q factor of the configuration of this preferred embodiment, while the broken lines indicate the Q factor of the configuration of the related art. In FIG. 7, L22 indicates the frequency characteristics exhibited when the inductor 22 is selected as a result of closing the switch 21 and opening the switch 23, and L22+L24 indicates the frequency characteristics exhibited when a series inductor of the inductors 22 and 24 is selected as a result of opening the switch 21 and closing the switch 23. The configuration of the related art refers to a structure in which a switch is connected in series with each inductor. Accordingly, the state of L22+L24 corresponds to the state in which an inductor L3 equivalent to L22+L24 is singly selected.

As shown in FIG. 7, when the inductor 22 is selected, the Q factor of the configuration of this preferred embodiment does not decrease even when the frequency is around 3.0 GHz, but on the other hand, the Q factor of the configuration of the related art starts to decrease from about 2.8 GHz. When a series inductor of the inductors 22 and 24 is selected, the Q factor of the configuration of this preferred embodiment does not decrease until the frequency reaches 3.0 GHz, but on the other hand, the Q factor of the configuration of the related art increases to the maximum value when the frequency is about 1.5 GHz and starts to sharply drop when the frequency exceeds 1.5 GHz.

The reason for the above-described results is as follows. As the frequency increases, the parasitic capacitance increases, and even for an opened switch, series resonance of this opened switch and an inductor connected to a switch is generated. However, unlike a configuration of the related art in which the connections of individual inductors are switched independently, as in the configuration of this preferred embodiment, the frequency of series resonance generated by an opened switch and an inductor is shifted to a higher-frequency band that does not influence the frequency of a communication signal, thus making it possible to improve the Q factor.

In this manner, with the use of the configuration of this preferred embodiment, RF signals are transmitted with even lower loss.

Figure 8:
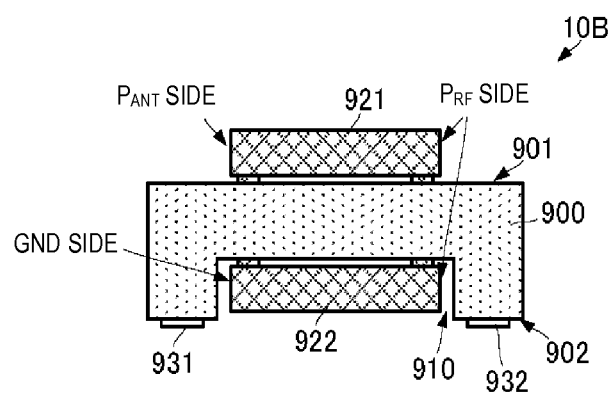
FIG. 8 is a sectional side view illustrating the antenna matching device according to the third preferred embodiment of the present invention.

The antenna matching device 10B having the above-described circuit configuration is implemented by the following structure. FIG. 8 is a sectional side view illustrating the antenna matching device of this preferred embodiment. In FIG. 8, circuit elements implementing the inductors and conductor patterns implementing the detailed circuit are not shown.

The antenna matching device 10B includes a multilayer body 900. The multilayer body 900 includes a stack of a predetermined number of dielectric layers on which conductor patterns are provided. These conductor patterns implement a circuit configuration in which the individual circuit elements (inductors and switches) of the above-described antenna matching device 10B are connected to each other.

On the top surface of the multilayer body 900, a mount pattern is provided. A mount-type switch element 921 is mounted on the top surface of the multilayer body 900, and a plurality of mount-type inductor elements implementing the respective inductors are also mounted on the top surface of the multilayer body 900. The switches 12 and 21 are integrated in the mount-type switch element 921. The mount-type switch element 921 preferably has, for example, a rectangular or substantially rectangular shape, as viewed from above, and includes one side and the other side opposing each other. Terminals of the switches 12 and 21 closer to the antenna terminal $P_{ANT}$ are disposed on one side, while terminals of the switches 12 and 21 closer to the RF terminal $P_{RF}$ are disposed on the other side.

On the bottom surface of the multilayer body 900, a recessed portion 910 is provided, except for an area having a predetermined width along the outer periphery of the multilayer body 900. The recessed portion 910 is formed with an area and a depth by which a mount-type switch elements 922 is stored therein. On the top surface of the recessed portion 910 (a surface parallel or substantially parallel with the top surface of the multilayer body 900), land conductors to mount the mount-type switch element 922 are provided.

The switches 13 and 23 are integrated in the mount-type switch element 922. The mount-type switch element 922 preferably has the same or substantially the same shape as that of the mount-type switch element 921. Terminals of the switches 13 and 23 closer to a ground GND are disposed on one side, while terminals of the switches 13 and 23 closer to the RF terminal $P_{RF}$ are disposed on the other side.

The mount-type switch element 922 is mounted on the multilayer body 900 such that it is connected to the land conductors provided within the recessed portion 910. With this configuration, the mount-type switch element 922 is mounted such that it is stored within the multilayer body 900.

In this case, the mount-type switch element 922 is disposed such that it opposes the mount-type switch element 921. In other words, when viewing the multilayer body 900 from above, the mount-type switch element 922 is disposed such that it is superposed on the mount-type switch element 921, and the switches 12 and 13 are superposed on each other in the stacking direction. With this configuration, the area of the multilayer body 900 as viewed from above is significantly reduced to be smaller than that when both of the mount-type switch elements 921 and 922 are mounted on the top surface of the multilayer body 900. Accordingly, the area and the size of the multilayer body 900 is significantly reduced.

On the outer periphery of the bottom surface of the multilayer body 900, land conductors 931 and 932 for external connection are provided. The land conductor 931 is a terminal corresponding to the antenna terminal $P_{ANT}$ of the antenna matching device 10B, while the land conductor 932 is a terminal corresponding to the RF terminal $P_{RF}$ of the antenna matching device 10B. In this case, the mount-type switch elements 921 and 922 are mounted such that the terminals closer to the RF terminal $P_{RF}$ are disposed adjacent to the land conductor 932.

With this configuration, the mount-type switch elements 921 and 922, that is, the terminals of the switches 12, 13, 21, and 23 closer to the RF terminal $P_{RF}$ are disposed adjacent to the land conductor 932. This makes it possible to simplify wiring patterns within the multilayer body 900, thus reducing the area of the multilayer body 900. In particular, by superposing the switch elements 12 and 13 in the stacking direction, the line length to connect the switch element 12 and the antenna terminal $P_{ANT}$ is short and preferably is the same or substantially the same as the line length to connect the switch element 13 and the antenna terminal $P_{ANT}$. This makes it possible to significantly reduce, minimize or prevent the influence of the line length between the antenna terminal $P_{ANT}$ and the antenna matching device 10B on the transmission characteristics of RF signals.

FIG. 8 shows an example in which the mount-type switch element 921 is disposed on the top surface of the multilayer body 900, while the mount-type switch element 922 is disposed within the recessed portion 910 of the multilayer body 900. However, the arrangement of the mount-type switch elements 921 and 922 with respect to the multilayer body 900 may be vice versa. An example in which the switches 12 and 21 are implemented by the mount-type switch element 921, while the switches 13 and 23 are implemented by the mount-type switch element 922 has been discussed. However, another combination of the switches is possible. Alternatively, a mount-type switch element may be provided for each switch.

Examples in which two or three transmission paths are selected have been discussed above. However, four or more transmission paths may be selected. In this case, one transmission path may be configured such that it connects the antenna terminal $P_{ANT}$ and the RF terminal $P_{RF}$ without passing through a switch.

Although it has not been specifically discussed above, the transmission path for RF signals that are most desirably transmitted with the minimal loss may be set to be a transmission path without a switch. The reason for this is that the transmission loss caused by an inductor is smaller than that by a switch, as discussed above.

Additionally, an example in which an inductor, which is configured to increase the wavelength, preferably is used, has been discussed above. However, a capacitor, which is configured to decrease the wavelength, may be used. In this case, the frequency of an RF signal for which a transmission path without a capacitor is selected may be set to be a lower frequency of a frequency range to be transmitted.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An antenna matching device connected between an antenna and an RF circuit to perform impedance matching between the antenna and the RF circuit, the antenna matching device comprising:
   between an antenna terminal connected to the antenna and an RF terminal connected to the RF circuit:
   a first transmission path to which only a first impedance adjusting element is connected;
   a second transmission path including a first switch, and a third transmission path in which a second impedance adjusting element and a second switch are connected in series with each other; wherein
   the first and second transmission paths are connected in parallel with each other; and
   the third transmission path is connected in parallel with the first and second transmission paths.

2. The antenna matching device according to claim 1, wherein the second impedance adjusting element is connected between the second switch and the antenna terminal.

3. The antenna matching device according to claim 1, wherein a value of the first impedance adjusting element is determined so that impedance matching is performed between the antenna terminal and the RF circuit in a frequency band of a signal for which a gain of the antenna is a minimum among frequency bands to be used.

4. The antenna matching device according to claim 1, further comprising a shunt-connection impedance adjusting unit including a third impedance adjusting element connected between the RF terminal and a ground.

5. The antenna matching device according to claim 4, wherein the shunt-connection impedance adjusting unit includes switches and inductors.

6. The antenna matching device according to claim 5, wherein the switches a Single-Pole/Single-Throw switches.

7. The antenna matching device according to claim 4, wherein:
   the shunt-connection impedance adjusting unit includes a third switch connected between the third impedance adjusting element and the RF terminal, and a series circuit including a fourth switch and a fourth impedance adjusting element;
   the series circuit of the fourth switch and the fourth impedance adjusting element is connected in parallel with the third switch; and
   the fourth impedance adjusting element is disposed for the third impedance adjusting element in relation to the fourth switch.

8. The antenna matching device according to claim 1, wherein:
   the antenna matching device includes a multilayer body including a stack of dielectric layers on which conductor patterns defining a circuit of the antenna matching device are provided;
   a plurality of switches includes at least two mount-type switch elements;
   a recessed portion is provided in a region of a bottom surface of the multilayer body; and
   the mount-type switch elements are mounted on a top surface of the multilayer body and on a surface of the recessed portion parallel or substantially parallel with the top surface.

9. The antenna matching device according to claim 8, wherein, in a state in which the mount-type switch elements are mounted on the top surface of the multilayer body and on the surface of the recessed portion parallel or substantially parallel with the top surface of the multilayer body, mounting terminals of the mount-type switch elements to be connected to the RF terminal are disposed on a same side as a side of a main unit of the mount-type switch elements to be connected to the RF terminal.

10. The antenna matching device according to claim 1, wherein the first impedance adjustment element includes one of an inductor and a capacitor.

11. The antenna matching device according to claim 10, wherein the inductor is one of a chip component and a conductor line.

12. The antenna matching device according to claim 1, wherein the first switch is a Single-Pole/Single-Throw switch.

13. The antenna matching device according to claim 1, wherein the first and second transmission paths are configured to transmit an RF signal without passing through a switch.

14. The antenna matching device according to claim 1, wherein the antenna matching device is configured to use only the first switch to switch between signals of two frequency bands and transmit a selected band signal.

15. The antenna matching device according to claim 1, wherein the second impedance adjustment element includes one of an inductor and a capacitor.

16. The antenna matching device according to claim 15, wherein the inductor is one of a chip component and a conductor line.

17. The antenna matching device according to claim 1, wherein the second switch is a Single-Pole/Single-Throw switch.

18. A wireless communication apparatus comprising:
   an antenna;
   an RF circuit; and
   the antenna matching device of claim 1 arranged to connect the antenna and the RF circuit.

19. The wireless communication apparatus according to claim 18, wherein the wireless communication apparatus is a wireless-communication front end module.

\* \* \* \* \*